United States Patent [19]

Thomas et al.

[11] 4,434,470
[45] Feb. 28, 1984

[54] SPEED MEASUREMENT SYSTEM WITH MEANS FOR CALCULATING THE EXACT TIME PERIOD OF A KNOWN QUANTITY OF SPEED PULSES

[75] Inventors: Robert C. Thomas; John A. Hornbuckle; Richard J. Fatka, all of South Bend, Ind.

[73] Assignee: The Bendix Corporation, Southfield, Mich.

[21] Appl. No.: 232,615

[22] Filed: Feb. 9, 1981

[51] Int. Cl.³ .................. G01P 3/481; G01B 7/14; G06F 15/20
[52] U.S. Cl. .................. 364/565; 324/166; 377/19; 377/49
[58] Field of Search ............ 364/565; 324/166, 173, 324/174; 377/19, 23, 24, 47, 48, 49

[56] References Cited

U.S. PATENT DOCUMENTS

| | | | |
|---|---|---|---|
| 4,055,993 | 11/1977 | Rackliffe et al. | 324/173 |
| 4,056,778 | 11/1977 | Randazzo | 324/166 |
| 4,199,719 | 4/1980 | Grob | 364/565 X |
| 4,257,005 | 3/1981 | Hall | 324/166 |
| 4,329,645 | 5/1982 | Takase | 324/166 |

Primary Examiner—Felix D. Gruber
Attorney, Agent, or Firm—William A. Marvin; Ken C. Decker

[57] ABSTRACT

A digital speed measurement circuit for an engine includes a magnetic pick-up positioned adjacent an engine-driven gear having a substantial number of teeth so that the pick-up produces a number of speed pulses per revolution of the gear. These pulses are shaped into square waves by a signal conditioning circuit and connected through a synchronizing circuit which responds to the trailing edge of each square wave to produce a triggering pulse, with each triggering pulse supplied to a tooth counter. A high speed clock is connected to a second counter which is reset with each triggering pulse. Sampling pulses are produced in an associated control system which is not coordinated with the speed pulse but which are longer in duration than any of the speed pulses and which control the flow of tooth counts to the tooth counter. Memory circuits retain the high speed counts measuring the intervals between a triggering pulse and the beginning of a sampling pulse and between the end of the sampling pulse and the triggering pulse immediately preceding. Another counter counts the high speed counts occurring during the sampling pulse period. These factors are combined as described to provide a high speed count of a new measuring interval exactly related to the speed pulse count and which is combined with the speed pulse count to provide a digital signal which accurately represents a desired function of engine rotational speed.

8 Claims, 2 Drawing Figures

SPEED MEASUREMENT SYSTEM WITH MEANS FOR CALCULATING THE EXACT TIME PERIOD OF A KNOWN QUANTITY OF SPEED PULSES

BACKGROUND OF THE INVVENTION

Electronic governing devices of the analog type have been available for decades. These typically take an a.c. speed signal from an engine-driven tachometer-generator, rectify and filter it to arrive at a d.c. level representative of instantaneous speed, and compare this with a d.c. reference to fine a speed error signal which is then used to correct any speed error. Such circuits are subject to the usual problems with any voltage sensitive analog control in that they are subject to error from temperature and aging effects on the components, from supply voltage variations, etc. so that, for many applications, their accuracy is not what might be desired.

For a gas turbine control system there are other engine operating variables used to determine fuel flow such as compressor discharge pressure, ambient temperature, and turbine temperature. Since in the control system these various analog signals are effectively multiplied together, errors tend to become cumulative. Currently it is desired to provide digital control systems which are much less sensitive to the above sources of error. It therefore becomes useful and basically necessary to provide a speed sensing circuit which will provide an accurate and reliable digital signal representing instantaneous engine speed on an almost real time basis.

Most methods of producing a digital rotational speed (r.p.m.) signal depend upon generating a pulse train with a frequency proportional to the rotation rate. Although the pulse rate could be at the same rate as the rotation of the measured shaft (i.e., one pulse per revolution) or at some submultiple of the measured shft speed, it is more common to generate a multiplicity of pulses corresponding to each revolution of the measured shaft as, for example, mounting an electromagnetic pickup coil adjacent to a gear on the rotating body, electro-optically sensing the passage of holes or slots in a rotating disc, or the like. Use of a multiplicity of pulses per revolution permits a more accurate digital representation of the instantaneous rotation rate. Since the pulses so generated are actually representative of angular position, conversion to rotation rate requires the introduction of the element of time. This is customarily done either by a frequency measurement, in which the number of pulses representative of the shaft rotation is counted over a fixed (or at least known) time interval, or by a period measurement, in which the number of increments of some short time (i.e., a known high frequency pulse train) is counted between occurences of the rotation-derived pulses or a known multiple of the rotation-derived pulses.

The frequency measurement method is inherently limited at low rotation speed; as the number of rotation-derived pulses in the reference time interval becomes less, the digitized accuracy becomes poorer. The period measurement method is inherently limited at high rotation speeds as the number of time increments during the interval between rotation-derived pulses becomes less, and likewise the digitized accuracy becomes poorer. Period measurements usually suffer from the additional disadvantage that system constraints render it difficult to count each period between successive shaft-related pulses unless special techniques are employed or high-speed memory transfer with simultaneous counter reset is applied. Additional constraints are imposed in a control system by the required control response time (usually short) and, in microprocessor-derived control systems, the requirement that a value for the measured variable (i.e., the shaft speed) that is as current as practical be available to the microprocessor on demand. Further, the cyclic operation of the control microprocessor is completely asynchronous with the shaft rotation.

The U.S. Pat. to Shibata, No. 3,892,952, shows a digital speed detector generating pulses having a frequency proportional to the vehicle speed being measured, a reference pulse generating circuit for generating references pulses having a predetermined frequency, and a timing pulse generator for generating reference timing pulses. In this system the leading edge of a reference timing pulse and a detector pulse representing rotational speed are synchronized with the leading edge of a reference pulse. The trailing edge of the reference timing pulse is effectively extended to the leading edge of the first speed detector output pulse appearing after the end of the duration of the reference timing pulse to determine a counting period. The number of detector output pulses (speed pulses) and the number of reference pulses received during the extended counting period are counted by first and second counters, respectively. The counts of the first and second counters are subjected to a division operation to obtain a displacement speed which, in turn, is subtracted from the previously obtained displacement speed. In this system the counting period is equal to the duration of the reference timing pulse extended by less than one pulse period of the sensor output pulses, which is alleged to provide reduced differentiation error and shorter response time.

One drawback to the system described above is that the time between speed measurement readings is a variable depending upon the speed frequency being measured. In a digital system where the cycle time may be in the neighborhood of 20 msec. this variable will become quite significant at low frequencies. Another disadvantage of this system is that it appears that one speed input pulse is effectively disregarded between speed measurements which tends to further restrict low speed accuracy and the minimum low frequency signal which can be processed.

SUMMARY OF THE INVENTION

Accordingly, the invention provides a speed measurement system with means for calculating the exact time period of a known quantity of speed pulses whose frequency is proportional to the rotational velocity of a sensing member.

Pulses from a high frequency vernier clock are counted between the initiation of a sampling interval (IT) and the last previous speed pulse occurring before that initiation to generate an interval $(T_{i-1})$ which is added to the known sampling interval. Additionally, the high frequency vernier clock pulses are counted between the termination of the sampling interval (IT) and the last previous speed pulse occurring before that termination to generate an interval $(T_i)$ which is subtracted from the known sampling interval. By modifying the sampling interval in this manner an exact time period $(IT-(T_i-T_{i-1}))$ is generated in which a known number of speed pulses occur. The rotational velocity of the sensing member is then obtained by dividing the known number of speed pulses by the exact time period over which they occur.

These and other objects, features, and aspects of the invention will be more clearly understood and better described if a reading of the detailed description is undertaken in conjunction with the appended drawings, wherein:

DETAILED DESCRIPTION OF THE PREFERRED EMBODIMENT

Figure 1:
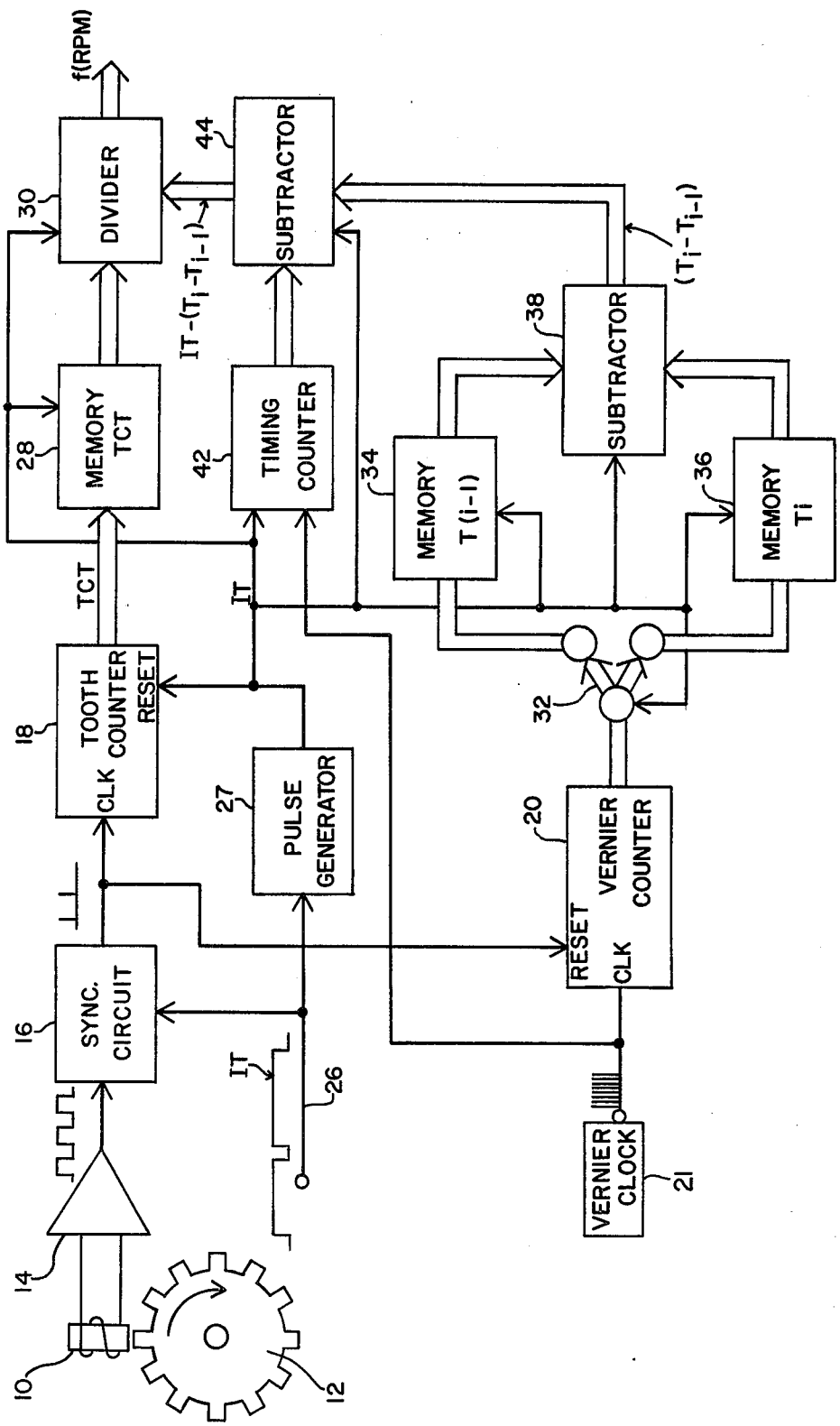
FIG. 1 is a schematic block diagram of a speed signal producing system according to our invention.

Referring now to FIG. 1, a binary tooth counter is shown consisting of a magnetic pickup 10 positioned adjacent the teeth of an engine-drive gear 12 such that it produces a pulse as each tooth passes the pickup. The pulses from pickup 10 are processed in a signal conditioning circuit 14 where they are converted to a signal consisting of a series of square waves, one per pulse. These are supplied to a synchronizing circuit 16 and from there to a tooth counter 18 which includes clock input and reset terminals.

A second binary counter 20 is clocked at a constant rate and receives an input from a high speed vernier clock 21 forming part of an associated computer or data processing system. An enable signal is provided on a line 26 from an interval timer forming part of the associated data system. This enable signal (IT) provides to synchronizing circuit 16 a sampling pulse of a desired length which is controlled by the real time clock in the data processing system which is sourced by the same oscillator as the vernier clock. During the period of signal IT, synchronizing circuit 16 gates tooth count pulses (triggering pulses) to the tooth counter 18 and to the reset terminal of vernier counter 20. Successive IT signals are also supplied to a pulse generator 27 which provides pulse output signals to reset tooth counter 18 at the end of a pulse IT.

Figure 2:
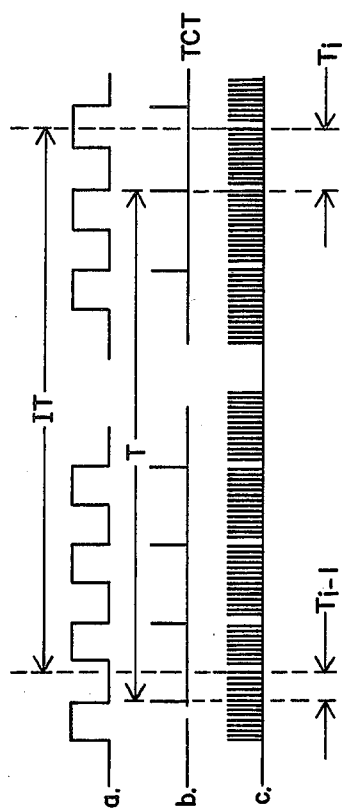
FIG. 2 is a timing chart showing waveforms generated at various points in the circuit of FIG. 1.

FIG. 2 is a timing diagram showing the relationships of the measured quantities and the process being measured which, in this case, is engine speed. The shaped pulses representative of the measured speed appear as square waves at the output of signal conditioning circuit 14. These are shown on line a. The synchronizing circuit 16 receives the square waves and responds to the trailing edge of each square wave to provide one tooth count (TCT) pulse to counter 18 for each of the square waves on line a (see line b).

On line c appear the high speed counts from the vernier clock which are supplied to the vernier counter 20. While counter 20 receives and counts a steady stream of high speed counts, each reset pulse causes this counter to discard its then current count and begin counting anew from zero.

The interrupt request signal IT (sampling interval) from the associated data system is not coordinated with the tooth count, so for accurate measurement it is desirable to provide a vernier count representative of the time difference between the beginning of the sampling interval IT and the previous tooth count pulse and between the end of sampling interval IT and the immediately previous tooth count pulse. The first of these intervals is shown on FIG. 2 as the left hand space between the vertical dotted lines representing the intervals IT and T and is designated $T_i - 1$. The second such interval representing the time difference between the end of count-measuring interval T and sampling interval IT is shown at the right end of the diagram designated $T_i$. From FIG. 2 it is clear that (1) $T = IT - T_i + T_{i-1}$.

If $T_v$ is defined as the period of the vernier clock in seconds, $T_i$ is the current vernier count and $T_{i-1}$ is the vernier count from the previous iteration, then (2) $T_i = T_v \cdot T_i$ in seconds, and
(3) $T_{i-1} = T_v \cdot T_{i-1}$ in seconds.

By substitution:

(4) $T = IT - T_v \cdot VCT_i + T_v + T_v VCT_{i-1}$
(5) $T = IT - T_v(VCT_i - VCT_{i-1})$ Exactly TCT teeth are counted during the measurement interval T. If there are PR teeth on the pickup wheel then (6) TCT revolutions occur during the measurement interval T. PR Therefore:

$$RPM = \frac{\frac{TCT}{PR} \text{ revolutions} \times 60 \frac{\text{seconds}}{\text{minute}}}{T \text{ seconds}} \quad (7)$$

$$RPM = \frac{60 \times \frac{TCT}{PR}}{IT - T_v(VCT_i - VCT_{i-1})} \quad (8)$$

The TCT output of the tooth counter 18 is supplied to a memory unit 28 which retains the number of TCT counts in each measuring interval T and which supplies them on demand to a divider circuit 30. Similarly, the vernier counter 20 supplies the high speed counts through a gate 32 which alternately connects the vernier counter 20 to either of a memory 34 which stores vernier counts $T_{i-1}$ or to a memory 36 which stores vernier counts $T_i$.

These counts are supplied at the end of the sample pulse to a subtracter 38 which supplies the difference signal $(T_i - T_{i-1})$. A timing counter 42 receives a vernier clock input from the associated data processing system and provides a digital signal representing the sampling interval IT. This sampling interval signal IT and the output of the subtractor 38 which represents $(T_1 - T_{i-1})$ are subjected to a subtraction operation in a subtracter 44. The difference which represents the denominator in the above equation (8) is supplied to divider circuit 30 which also receives the TCT signal from memory 28. It is apparent that both the quantity 60 and the quantity PR in the numerator are constants which may be incorporated into memory circuit 28; thus the output of the memory circuit 28 is preferably the numerator of equation (8). The divider 30 will therefore provide a digital representation of RPM or a desired function of RPM. A desired sealing factor to correct the vernier clock frequency to units of time may be introduced into memory units 28, 34 or 36 or downstream thereof to make the output of divider 30 a direct function of time rather than proportional to RPM.

Operation of the above describeed system will now be discussed relative to the timing diagram, FIG. 2. As indicated above, the tooth counter square wave signals from signal conditioner 14 are counted in the tooth counter 18 only when the synchronizing circuit 16 is enabled at the beginning of a sample period IT. Thus when an engine speed reading is requested, a sample period IT is begun, starting an accumulation of tooth counts TCT in counter 18. The vernier clock counts are continuously fed to counter 20 which is connected through gate 32 to memories 34 and 36. Upon the occurrence of the trailing edge of every tooth count pulse, the stored vernier counts in each of memories 34 and 36 are discarded and each memory immediately begins accumulating counts anew. If an interrupt request IT occurs in any given interval, the memory 34 will stop and store the vernier counts which it has, which becomes $T_{i-1}$. Subsequent counts are then counted in counter 20 while the opposite memory continues to accumulate counts and reset with the trailing edge of each tooth count pulse. At the end of the sampling interval IT, memory 36 will receive a signal telling it to stop and hold the pulses it has accumulated since the last tooth count trailing edge, which count becomes $T_i$. The end of sampling interval IT also becomes the signal for memory 28 to transfer its counts to divider 30 and for memory 34 to transfer its counts to subtracter 38 initiating the above described computations through subtracter 44, and divider 30. The associated data processor will then take the signal RPM signal from divider 30 and use it, in combination with other signals, to compute a fuel flow value or will use it for other purposes as needed. The processor may then resample the speed circuit almost immediately or may wait a period such as several sampling pulse widths or intervals before putting out another sample pulse.

Thus, the clock pulses are counted as above with not only all of the tooth pulses accounted for in the sample period, but a new measurement period T is synthesized in which vernier or high speed clock counts measuring fractions of a period between tooth counts occurring just before the beginning and the beginning of the sampling interval and those occurring just before the end of the sampling interval and the end of the sampling interval are accounted for. Thus, while synchronizing the sampling interval with the tooth counts is virtually impossible over a wide speed range, the system, in effect, synthesizes a synchronized measuring interval and avoids inaccuracies caused by losing a speed input pulse (tooth count) between measurements or by being subject to a substantially variable time period between speed measurements which leads to variable accuracies depending upon the frequency of the speed pulses being measured. With the above described system, the accuracy varies comparatively little with measured speeds at one end or the other of the measured speed range.

While the above system has been described in terms of a speed signal measurement system for an engine, it obviously can be used to provide a signal representing speeds of other rotating members. And while the above system has been described with separate counters and separate memory elements, various techniques are obvious to one skilled in the art by which the counting and memory devices could be functionally combined or a memory function performed in the associated control microprocessor in either committed or dynamically assigned memory addresses.

We claim:

1. For use with a digital fuel control for an engine, a speed measurement system comprising:
   engine driven means producing a pulse signal whose frequency varies with engine speed,
   clock means producing pulses of a uniform high frequency,
   signal conditioning means receiving said speed pulse signal and producing a square wave pulse signal of the frequency of said speed pulse signal,
   synchronizing circuit means connected to receive said square wave signal for producing reset pulses for each square wave pulse,
   a first counter operatively connected to said synchronizing circuit means,
   a second counter connected to receive said clock pulses,
   means, responsive to initiation of a sampling signal from the fuel control and connected to said synchronizing circuit, for causing said reset pulses to be counted in said first counter and to connect said reset pulses to said second counter,
   memory circuit means connected to said second counter, for storing the count of said second counter,
   means, responsive to each reset pulse, for causing said second counter to discard its accumulated counts of said clock pulses and begin counting said clock pulses anew,
   means, also responsive to the initiation of said sampling signal, for causing said second counter to transfer its count accumulated since the previous reset pulse to a first memory in said memory circuit means,
   a divider circuit and means connecting said first counter to said divider circuit,
   means responsive to the termination of said sampling signal for causing said second counter to transfer its count accumulated since the previous reset pulse to a second memory in said memory circuit means,
   first subtractor circuit means connected to said first and second memories producing an output representing the difference in the counts between said first and second memories,
   third counter means providing a count of the number of clock pulses in the period of said sampling signal,
   second subtractor circuit means subtracting the output of said said first subtractor circuit means from the output of said third counter means, and
   means connecting the output of said second subtractor circuit to said divider circuit such that upon termination of said sampling signal, the output of said first counter is divided by the output of said second subtractor circuit to produce a digital signal representing engine rotational speed.

2. For use with a digital fuel control for an engine including a high speed clock and means producing a sampling pulse, a speed measurement system comprising:
   means including engine driven means producing a square wave signal proportional to engine speed,
   a synchronizing circuit connected to receive said square wave signal and convert said signal to a series of sharp reset pulses of the same frequency as said signal,
   first and second counters connected to said synchronizing circuit and high speed clock respectively, such that the initiation of the sample pulse enables said synchronizing circit to conduct reset pulses to said first and second counters, receipt of each of said reset pulses by said second counter causing said counter to be reset to zero and begin counting high speed counts anew, and said first counter counts said reset pulses, first and second memory means connected to said second counter with said first memory means connected to accumulate and hold clock counts occurring between the initiation of said sampling pulse and the previous reset pulse and said second memory means connected to accumulate and hold clock counts occurring between the termination of said sampling pulse and the previous reset pulse, first subtractor circuit means connected to said first and second memory means producing an output representing the difference in counts contained in said first and second memory means, a divider circuit connected to said first counter and means responsive to the termination of said sampling pulse to transfer the counts of said first counter to said divider circuit, third counter means providing a count of the number of clock pulse counts during said sampling pulse, second subtractor circuit means subtracting the output of said first subtractor circuit from the output of said third counter means, and means connecting the output of said second subtractor circuit means to said divider circuit such that upon termination of said sampling pulse the output of said first counter is divided by the output of said second subtractor circuit means to produce a digital signal representing engine rotational speed.

3. In a control system for an engine including a high speed clock and means producing a sampling pulse, a speed signal producing circuit comprising:

means including a synchronizing circuit and engine-driven means producing a series of sharp reset pulses whose frequency varies directly with rotational speed of said engine, first and second counters connected to said synchronizing circuit and said high speed clock, respectively, such that the initiation of said sampling pulse enables said synchronizing circuit to conduct reset pulses to said first and second counters, receipt of each said reset pulse by said second counter causing said counter to be reset to zero and begin counting high speed counts anew, and said first counter counts said reset pulses, first and second memory means connected to said second counter with said first memory means connected to accumulate and hold clock counts occurring between the initiation of said sampling pulse and the previous reset pulse and said second memory means connected to accumulate and hold clock counts occurring between the termination of said sampling pulse and the previous reset pulse, and signal processing means including counter means providing a count of the number of clock pulse counts during said sampling pulse for providing a digital signal representing engine rotational speed according to the relationship:

$$RPM = \frac{60 \times \frac{TCT}{PR}}{IT - T_V(VCT_i - VCT_{i-1})}$$

where
RPM = engine revolutions per minute
TCT = the number of tooth counts (reset pulses) per sampling pulse
$P_R$ = the number of tooth pulses per revolution (a constant)

IT = the period of the sampling pulse in seconds
$T_V$ = the period of the high speed clock in seconds
$VCT_i$ = the number of high speed counts in said second memory means, and
$VCT_{i-1}$ = the number of high speed counts in said first memory means.

4. A speed measurement system for measuring rotational speed of a rotating member including a high speed clock and means producing a sampling pulse, said system comprising:

means rotatable in proportion to the rotational speed of said rotating member producing signal proportional to the speed of said rotating member, a synchronizing circuit connected to receive said signal and to convert said signal to a series of sharp reset pulses of the same frequency as said signal, first and second counters connected to said synchronizing circuit and said high speed clock, respectively, such that the initiation of said sampling pulse enables said synchronizing circuit to output reset pulses to said first and second counters, receipt of each of said reset pulses by said second counter causing said counter to be reset to zero and begin counting high speed counts anew, and said first counter counts said reset pulses, first and second memory means connected to said second counter with said first memory means connected to accumulate and hold clock counts occurring between the initiation of said sampling pulse and the previous reset pulse and said second memory means connected to accumulate and hold clock counts occurring between the termination of said sampling pulse and the previous reset pulse, first subtractor circuit means connected to said first and second memory means producing an output representing the difference in counts contained in said first and second memory means, a divider circuit connected to said first counter and means responsive to the termination of said sampling pulse to transfer the counts of said first counter to said divider circuit, third counter means providing a count of the number of clock pulse counts during said sampling pulse, second subtractor circuit means subtracting the output of said first subtractor circuit from the output of said third counter means, and means connecting the output of said second subtractor circuit means to said divider circuit such that upon termination of said sampling pulse the output of said first counter is divided by the output of said second subtractor circuit means to produce a digital signal representing rotational speed of said rotating member.

5. In a system for controlling the speed of a rotating member including a high speed clock and means producing a sampling pulse, a speed signal producing means comprising:

first means including a synchronizing circuit and means rotatable with said rotating member producing a series of sharp reset pulses whose frequency varies directly with the speed of said rotating member, first and second counters connected to said synchronizing circuit and said high speed clock, respectively, such that the initiation of said sampling pulse enables said synchronizing circuit to conduct reset pulses to said first and second counters, receipt of each said reset pulse by said second counter causing said counter to be reset to zero and begin counting high speed counts anew, and said first counter counts said reset pulses, first and second memory means connected to said second counter with said first memory means connected to accumulate and hold clock counts occurring between the initiation of said sampling pulse and the previous reset pulse and said second memory means connected to accumulate and hold clock counts occurring between the termination of said sampling pulse and the previous reset pulse, and signal processing means including counter means providing a count of the number of clock pulse counts during said sampling pulse for providing a digital signal representing engine rotational speed according to the relationship:

$$RPM = \frac{60 \times \frac{TCT}{PR}}{IT - T_V(VCT_i - VCT_{i-1})}$$

where
- RPM = revolutions per minute of the rotating member
- TCT = the number of reset pulses per sampling pulse
- $P_R$ = the number of reset pulses per revolution of the rotating member (a constant)
- IT = the period of the sampling pulse in seconds
- $T_V$ = the period of the high speed clock in seconds
- $VCT_i$ = the number of high speed counts in said second memory means and
- $VCT_{i-1}$ = the number of high speed counts in said first memory means.

6. A system for controlling the speed of a rotating member as set forth in claim 5 wherein said first means includes a magnetic pickup, said rotatable means includes a gear having a plurality of teeth movable in proximity to said magnetic pickup to produce a plurality of electrical pulses for each rotation of said gear and a signal conditioning circuit is included for converting said pulses to a square wave signal, said synchronizing circuit including means converting said square wave signal to said reset pulses.

7. A system for controlling the speed of a rotating member as set forth in claim 5 wherein said signal processing means includes a memory connected to said first counter for maintaining a count of said reset pulses, a divider circuit connected to receive said count from said memory, a subtractor connected to determine the difference between the counts in said first and second memories and a second subtracter connected to subtract the output signals of said first subtractor from the output of said counter means, the output of said second subtractor being connected to said divider.

8. A method of measuring the rotational speed of an apparatus, said method comprising the steps of:

generating a tooth count signal as a series of pulses, said tooth count signal having each pulse synchronously generated with one of the state transitions of a square wave signal;

generating an interval signal of a predetermined time period;

generating a high speed clock gin signal of a substantially higher frequency than said square wave;

counting the number of tooth count pulses of said tooth count signal occurring within said interval time period, thereby providing a tooth count;

dividing said tooth count by a number representative of the tooth count of a single revolution of the apparatus, thereby calculating the number of revolutions of the apparatus represented by said tooth count;

counting the number of high speed clock pulses occurring between the initiation of said interval time period and the first tooth count pulse prior to said initiation wherein that count is termed the $T_{i-1}$ count;

counting the number of high speed clock pulses occurring between the termination of said interval time period and the first tooth count pulse prior to said termination wherein that count is termed the $T_1$ count;

counting the number of high speed clock pulses occurring during said interval time period wherein that count is termed the IT count;

forming the summation of counts $IT+(T_i-1)-T_i$ wherein that count is termed the interval count; multiplying the interval count by the period of the high speed clock to yield an accurate time interval T over which said tooth count has occurred; and dividing the number of revolutions represented by said tooth count by the time interval T to yield a speed signal which is an accurate measurement of the rotational speed of the member.

* * * * *